United States Patent
Yoon et al.

(10) Patent No.: US 8,059,387 B2
(45) Date of Patent: Nov. 15, 2011

(54) MULTI LAYER CERAMIC CAPACITOR AND DC-LINK CAPACITOR MODULE USING THE SAME

(75) Inventors: Jung Rag Yoon, Gyeonggi-do (KR); Bong Wha Moon, Gyeonggi-do (KR); Tae Serk Chung, Gyeonggi-do (KR); Kyung Min Lee, Gyeonggi-do (KR); Sang Won Lee, Gyeonggi-do (KR)

(73) Assignee: Samhwa Capacitor Co., Ltd., Kyoungki-do (KR)

( * ) Notice: Subject to any disclaimer, the term of this patent is extended or adjusted under 35 U.S.C. 154(b) by 382 days.

(21) Appl. No.: 12/458,000

(22) Filed: Jun. 29, 2009

(65) Prior Publication Data
US 2010/0290173 A1 Nov. 18, 2010

(30) Foreign Application Priority Data
May 12, 2009 (KR) .................. 10-2009-0041252

(51) Int. Cl.
*H01G 4/06* (2006.01)
(52) U.S. Cl. ................ 361/321.2; 361/321.1; 361/303; 361/306.1; 361/306.3; 361/313
(58) Field of Classification Search ............ 361/321.2, 361/321.1, 308.1, 303, 301.2, 301.4, 306.1, 361/306.3, 309, 311–313
See application file for complete search history.

(56) References Cited

U.S. PATENT DOCUMENTS

| | | | | |
|---|---|---|---|---|
| 5,963,416 A | * | 10/1999 | Honda et al. | 361/306.1 |
| 6,252,761 B1 | * | 6/2001 | Branchevsky | 361/321.2 |
| 7,054,136 B2 | * | 5/2006 | Ritter et al. | 361/309 |
| 7,239,500 B2 | * | 7/2007 | Togashi et al. | 361/306.3 |
| 7,324,324 B2 | * | 1/2008 | Sugimoto et al. | 361/303 |
| 7,345,868 B2 | | 3/2008 | Trinh | |
| 7,463,475 B2 | * | 12/2008 | Kimura et al. | 361/306.1 |
| 7,529,077 B2 | * | 5/2009 | Yoshida et al. | 361/306.3 |

* cited by examiner

*Primary Examiner* — Nguyen T Ha
(74) *Attorney, Agent, or Firm* — Rosenberg, Klein & Lee

(57) ABSTRACT

Provided are a high voltage multi-layer ceramic capacitor (MLCC) that may enable a surface mounting, and may form a guide electrode between inner electrodes or between sealing electrodes to thereby prevent a decrease in an inner voltage, caused by a parasitic capacitance, and a director current (DC)-link capacitor module using the MLCC. The high voltage MLCC may include: a ceramic laminated body 110; a plurality of side electrode members 120 being formed on both sides of the ceramic laminated body 110, respectively; a plurality of connection electrode members 130 being formed on the ceramic laminated body 110 to be connected to the side electrode member 120; and a plurality of external electrodes 140 being formed on each of the connection electrode members 130, wherein the ceramic laminated body 110 comprises a plurality of first ceramic sheets 111 where a plurality of first inner electrodes 112 is connected to the plurality of side electrode members 120, respectively, and a plurality of second ceramic sheets 113 being disposed between the plurality of first ceramic sheets 111, and where a plurality of second inner electrodes 114 is formed in a location corresponding to the first inner electrode 111.

16 Claims, 16 Drawing Sheets

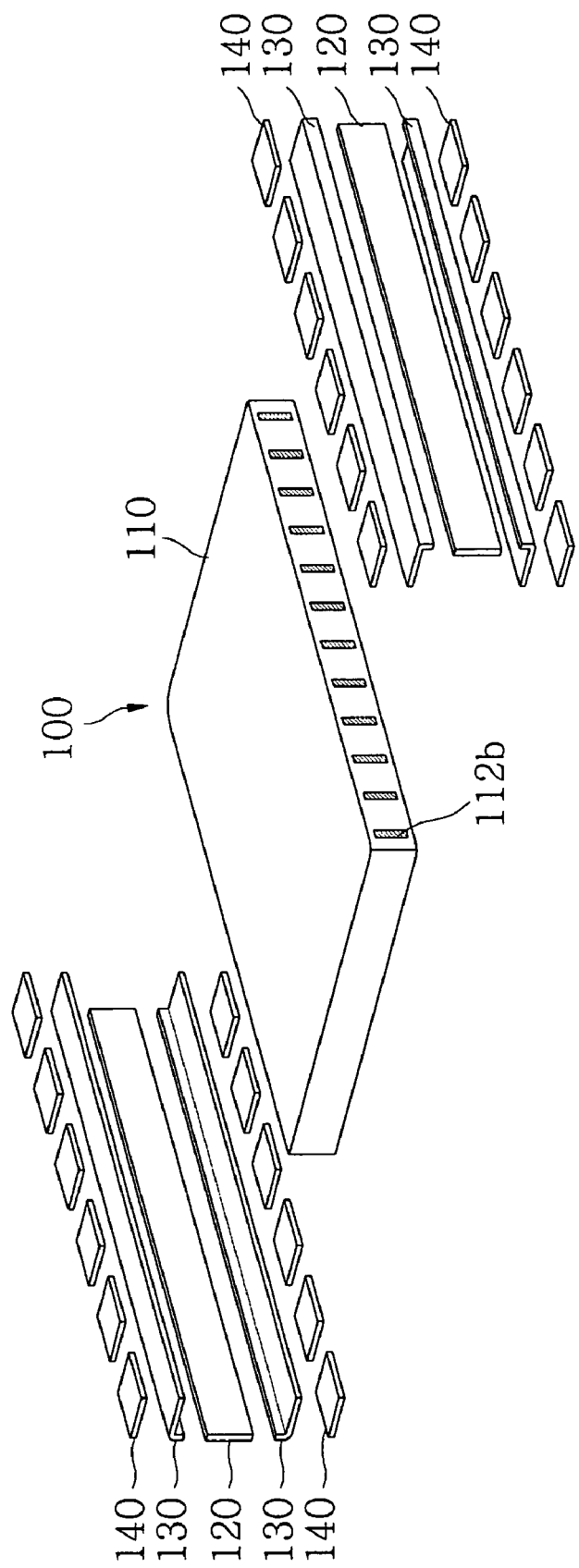

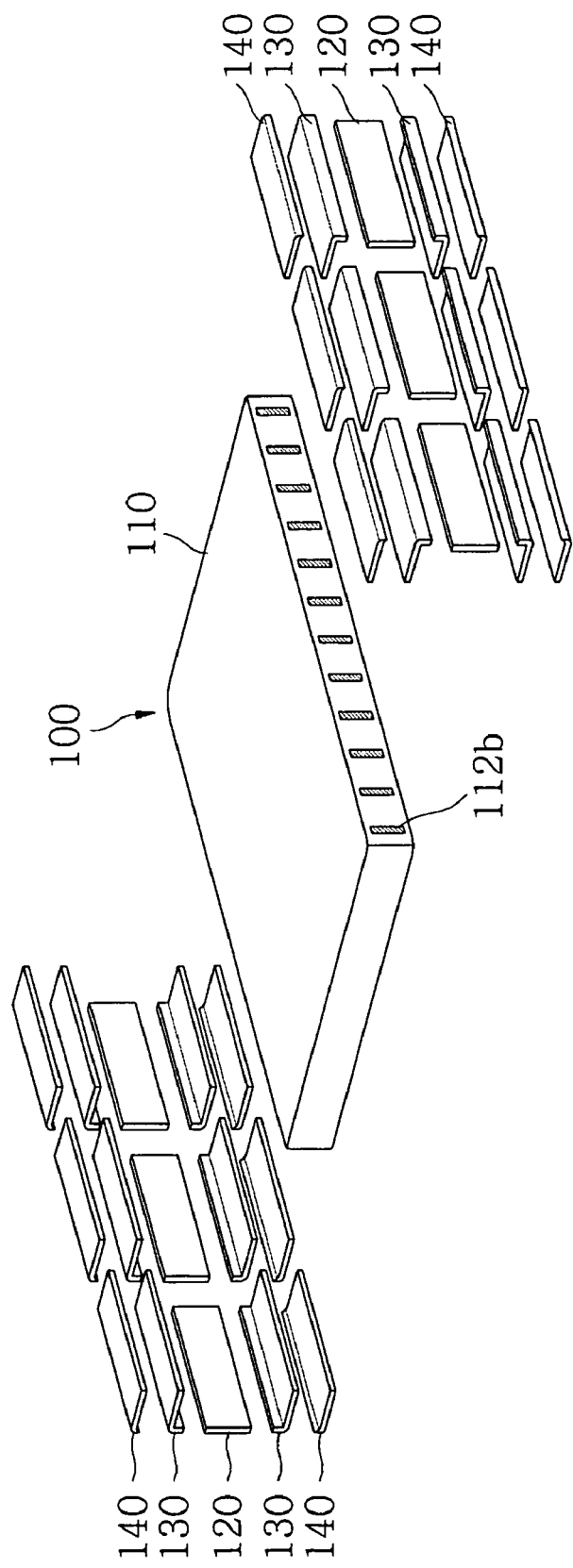

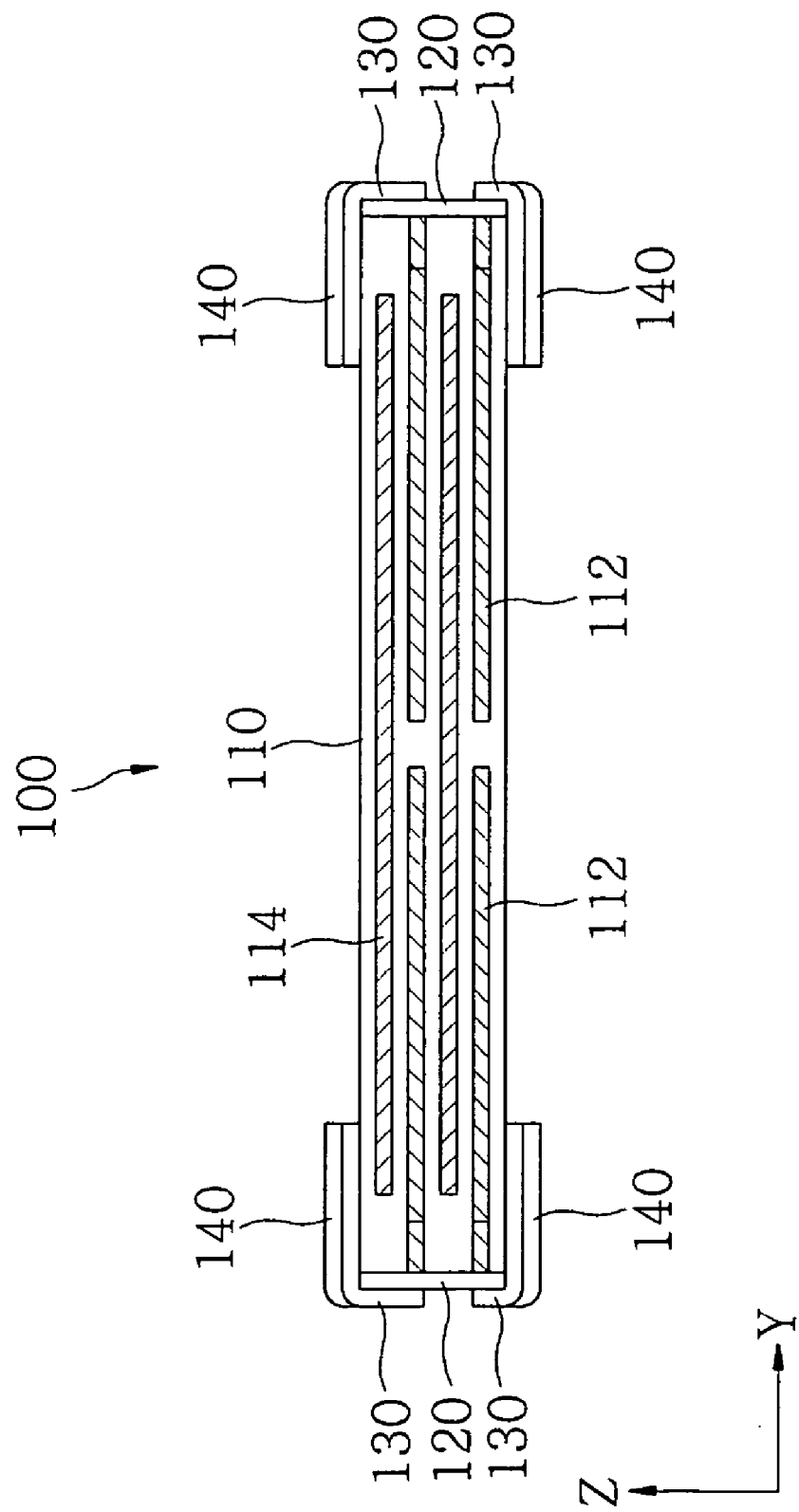

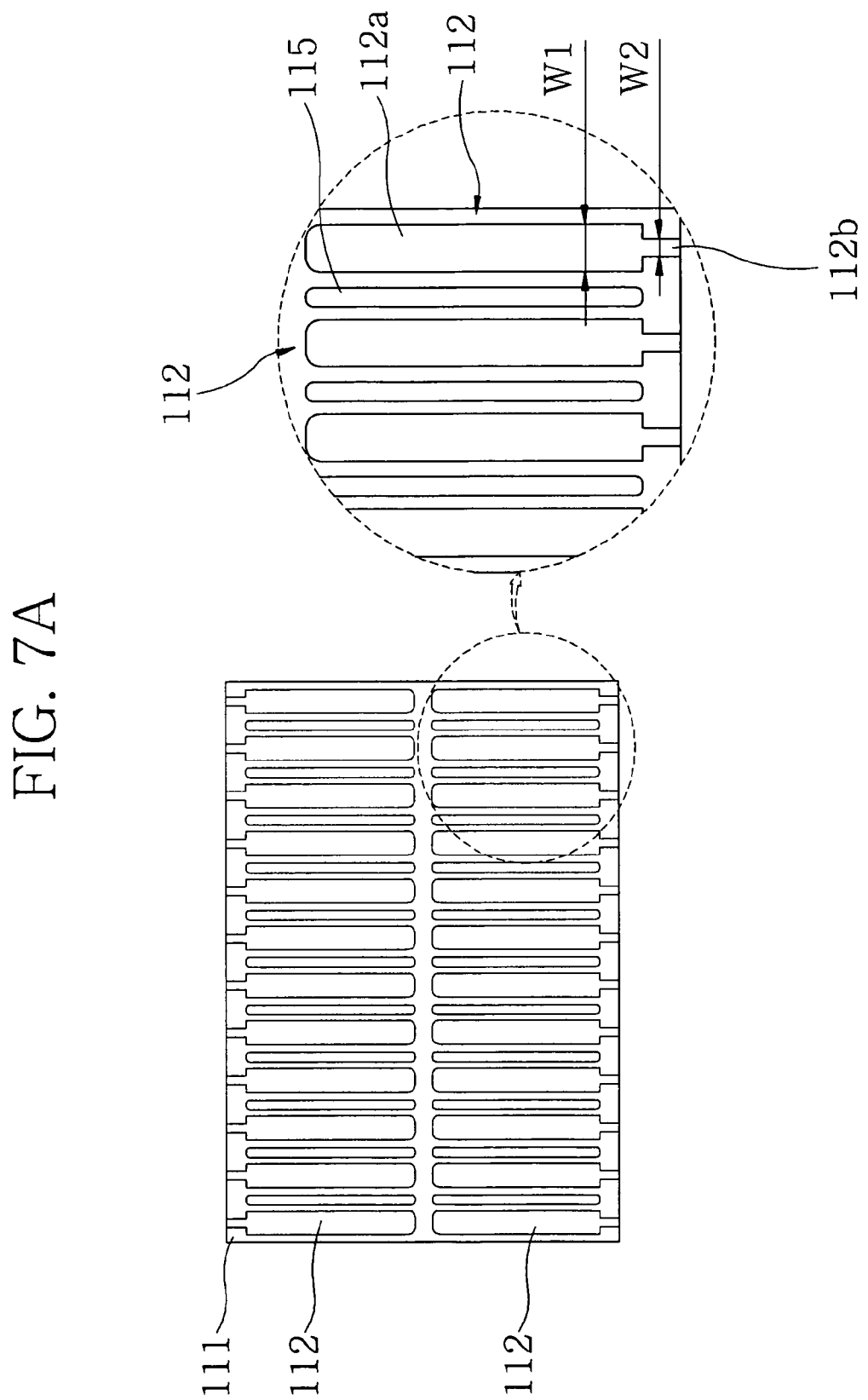

MULTI LAYER CERAMIC CAPACITOR AND DC-LINK CAPACITOR MODULE USING THE SAME

CROSS-REFERENCE TO RELATED APPLICATION

This application claims the benefit of Korean Patent Application No. 10-2009-0041252, filed on May 12, 2009, in the Korean Intellectual Property Office, the disclosure of which is incorporated herein by reference.

BACKGROUND OF THE INVENTION

1. Field of the Invention

The present invention relates to a high voltage multi-layer ceramic capacitor (MLCC) that may enable a surface mounting, and may form a guide electrode between inner electrodes or between sealing electrodes to thereby prevent a decrease in an inner voltage, caused by a parasitic capacitance, and a director current (DC) link capacitor module using the MLCC.

2. Description of the Related Art

An electric power transfer device of an electric vehicle or a hybrid vehicle that uses an electric drive source includes a battery, a capacitor module, an inverter, and a motor.

The electric power transfer unit constructed as above will be described with reference to FIG. 1.

A shown in FIG. 1, the electric power transfer unit of the electric vehicle or the hybrid vehicle may include a battery 1, a capacitor module 2, an inverter 3, and a motor 4.

The battery 1 may be used as a power source and the motor 4 may be used as a drive source. In order to control a driving speed and a torque of the motor 4, the inverter 3 may receive a pulse width modulation (PWM) duty signal from a micro processing unit (MCU) (not shown). The inverter 3 may be switched according to the received PWM duty signal to thereby convert a direct current (DC) power output from the battery 1, and may apply the DC power to the motor 4 to drive the vehicle.

The capacitor module 2 may smooth and stabilize the DC power supplied from the inverter 2, and decrease a current ripple to stably supply the DC power to the inverter 3. The capacitor module 2 stably supplying the DC power to the inverter 3 may be connected with a plurality of DC-link capacitors C1, C2, C3, and C4 in parallel. A high voltage multi-layer ceramic capacitor (MLCC) may be used for each of the capacitors C1, C2, C3, and C4. The horizontal length and the vertical length of the capacitors C1, C2, C3, and C4 are being enlarged to be used for a high voltage field. When providing external electrodes 2b of FIG. 2 in both ends of the enlarged capacitors C1, C2, C3, and C4, a conventional dipping scheme may be inapplicable.

When forming external electrodes 2a in both ends of the enlarged capacitor C1 by applying the dipping scheme as shown in FIG. 2, the external electrodes 2a may not be formed up to the surface of a ceramic laminated layer 2a. When the external electrode 2a is unstably formed, the capacitor 1 may not tightly contact with a printed circuit board (not shown) in manufacturing the capacitor module 2. Accordingly, due to a vibration, an impact, and the like occurring while driving a vehicle, a contact error may incur in the capacitor 1. In order to enhance the above shortage, a lead terminal (not shown) is used as the external electrode 2b in the conventional art.

When a lead terminal is used for a high voltage multi-layer ceramic capacitor (MLCC) used as a conventional direct current (DC) link, the lead terminal is inserted into a printed circuit board in manufacturing a capacitor module, which makes a mounting operation difficult.

SUMMARY OF THE INVENTION

The present invention is conceived to outperform the conventional art, and thus the present invention provides a high voltage MLCC that enables a surface mounting, and may form a guide electrode between inner electrodes or between sealing electrodes to thereby prevent a decrease in an inner voltage, caused by a parasitic capacitance, and a DC-link capacitor module using the MLCC.

Another aspect of the present invention also provides a high voltage MLCC that may form a guide electrode between inner electrodes or sealing electrodes to thereby prevent a surface bending caused by the inner electrodes or the sealing electrodes when forming a ceramic laminated body.

According to an aspect of the present invention, there is provided a high voltage multi-layer ceramic capacitor (MLCC) including: a ceramic laminated body; a plurality of side electrode members being formed on both sides of the ceramic laminated body, respectively; a plurality of connection electrode members being formed on the ceramic laminated body to be connected to the side electrode member; and a plurality of external electrodes being formed on each of the connection electrode members. The ceramic laminated body may include a plurality of first ceramic sheets where a plurality of first inner electrodes is connected to the plurality of side electrode members, respectively, and a plurality of second ceramic sheets being disposed between the plurality of first ceramic sheets, and where a plurality of second inner electrodes is formed in a location corresponding to the first inner electrode.

According to another aspect of the present invention, there is provided a direct link (DC)-link capacitor module including: a plurality of high voltage MLCCs, each, comprising a ceramic laminated body, a plurality of side electrode members being formed on both sides of the ceramic laminated body, respectively, a plurality of connection electrode members being formed on the ceramic laminated body to be connected to the side electrode member, and a plurality of external electrodes being formed on each of the connection electrode members; and a printed circuit board being mounted with the plurality of high voltage MLCCs. The printed circuit board may include an insulating base member, a first copper layer being disposed on any one of a top surface and a bottom surface of the insulating base member, and including a plurality of first openings to expose the insulating base member, a second copper layer being disposed on another one of the top surface and the bottom surface of the insulating base member, and including a second opening to expose the insulating base member, a plurality of copper patterns being formed on the insulating base member exposed by the plurality of first openings, a plurality of solder patterns being formed on the first copper layer and the plurality of copper patterns, and being mounted with the external electrodes of the high voltage MLCC, and a plurality of via-hole patterns being formed on the insulating base member to be connected to the plurality of copper patterns and the second copper layer.

BRIEF DESCRIPTION OF THE DRAWINGS

The above and/or other aspects of the present invention will become apparent and more readily appreciated from the following description of the exemplary embodiments, taken in conjunction with the accompanying drawings in which:

FIGS. 4A through 4C are exploded perspective views of a high voltage MLCC according to an embodiment of the present invention;

FIGS. 5A and 5B are cross-sectional views of an MLCC according to an embodiment of the present invention;

FIGS. 7A through 7E are plan views of various embodiments of first and second ceramic sheets of FIG. 6;

DETAILED DESCRIPTION OF THE INVENTION

Hereinafter, a high voltage multi-layer ceramic capacitor (MLCC) and a direct current (DC)-link capacitor module using the MLCC according to an embodiment of the present invention will be described with reference to the accompanying drawings.

Hereinafter, the high voltage MLCC according to an embodiment of the present invention will be described with reference to the accompanying drawings.

Figure 3A:
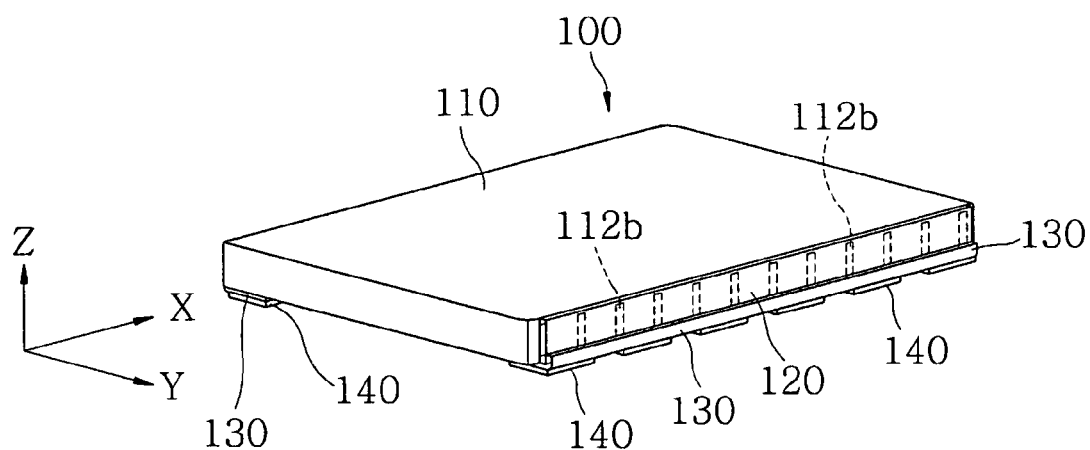
FIGS. 3A through 3C are perspective views of a high voltage multi-layer ceramic capacitor (MLCC) according to an embodiment of the present invention.
Figure 3B:
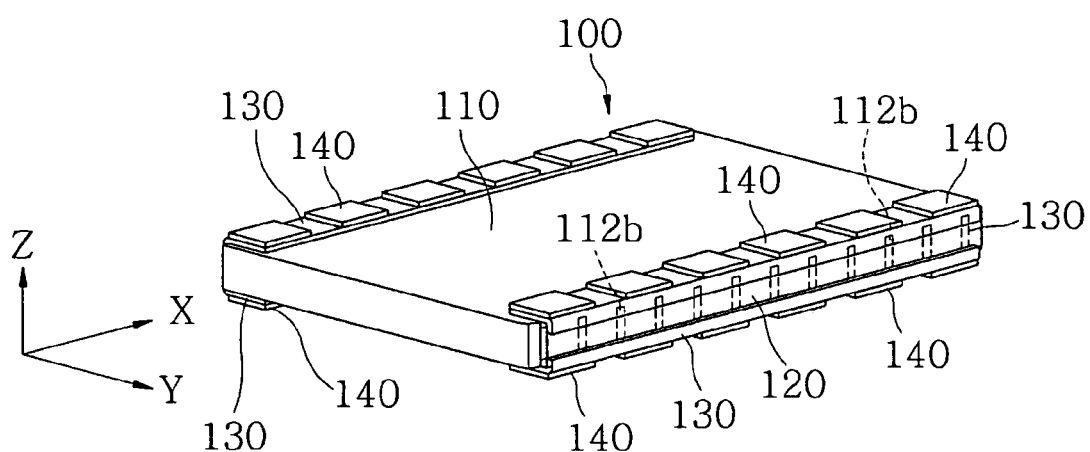
Figure 3C:
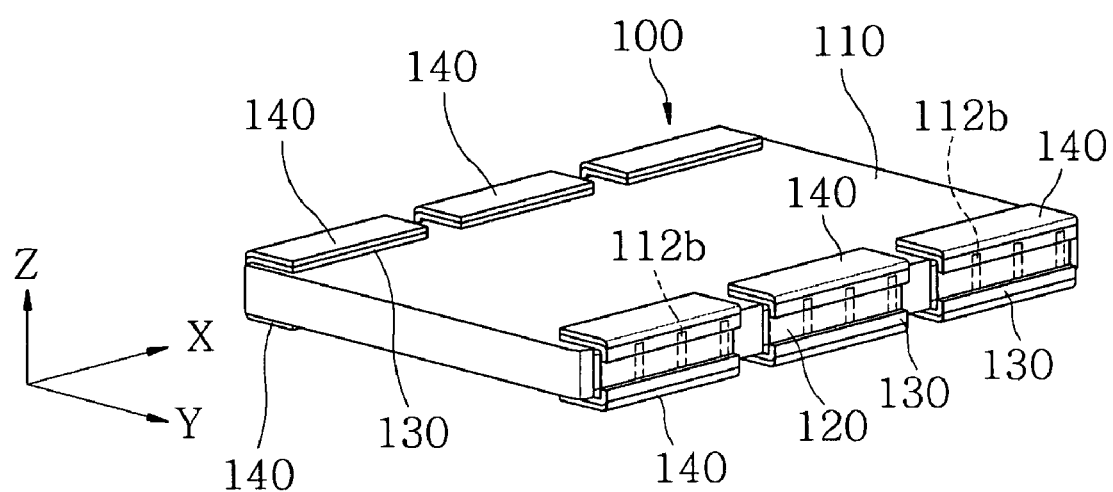
Figure 4A:
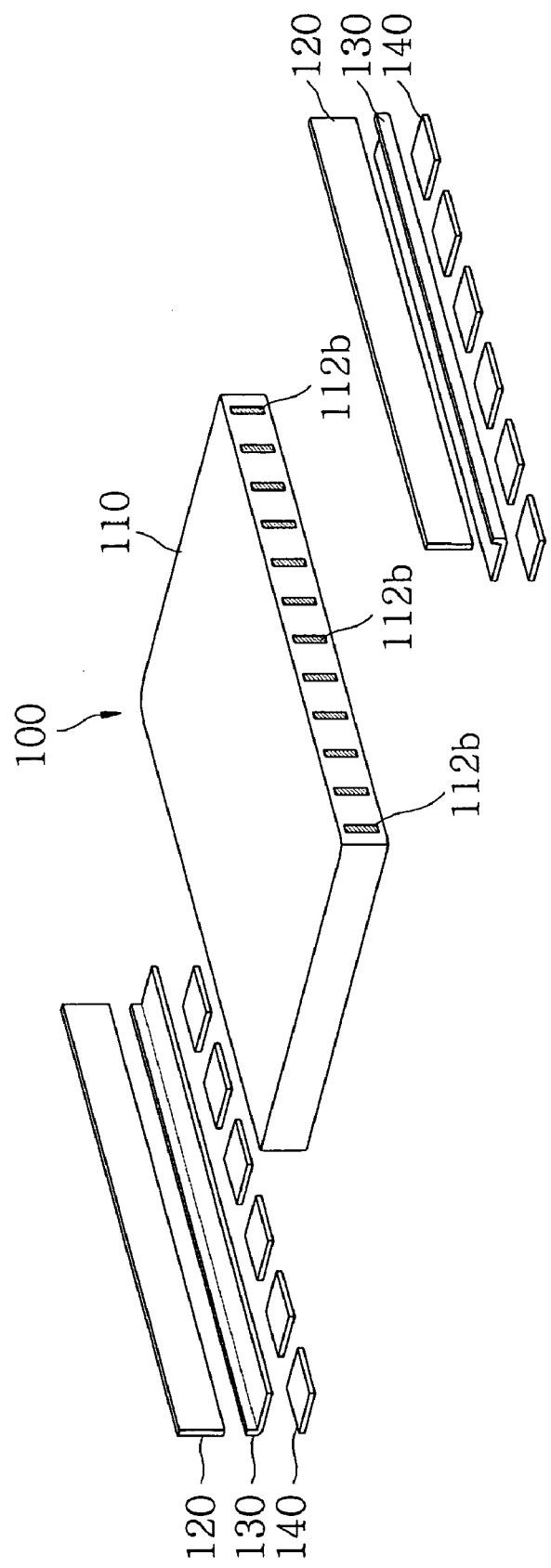

FIGS. 3A through 3C are perspective views of a high voltage MLCC according to an embodiment of the present invention, and FIGS. 4A through 4C are exploded perspective views of a high voltage MLCC according to an embodiment of the present invention.

As shown in FIGS. 3A and 4A, a high voltage MLCC 100 according to a first embodiment of the present invention may include a ceramic laminated body 110, a plurality of side electrode members 120, a plurality of connection electrode members 130, and a plurality of external electrodes 140.

Figure 5B:
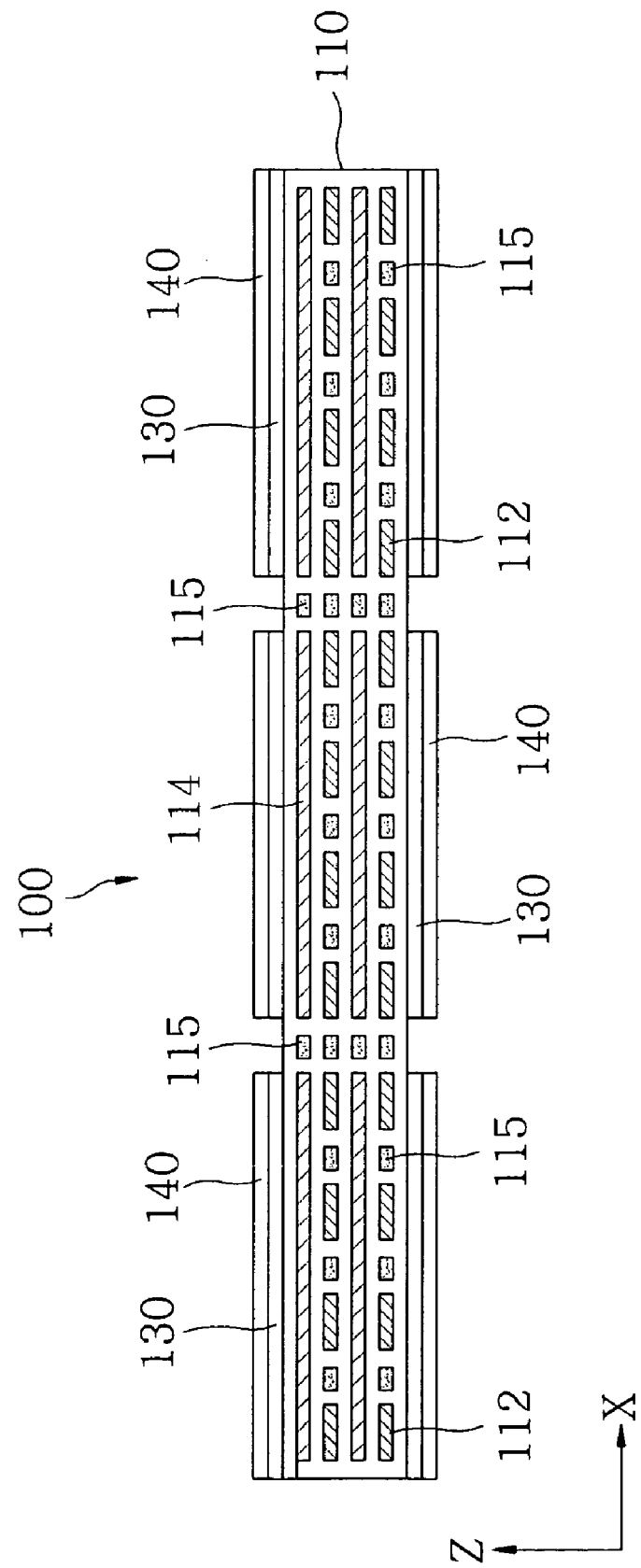
Figure 6:
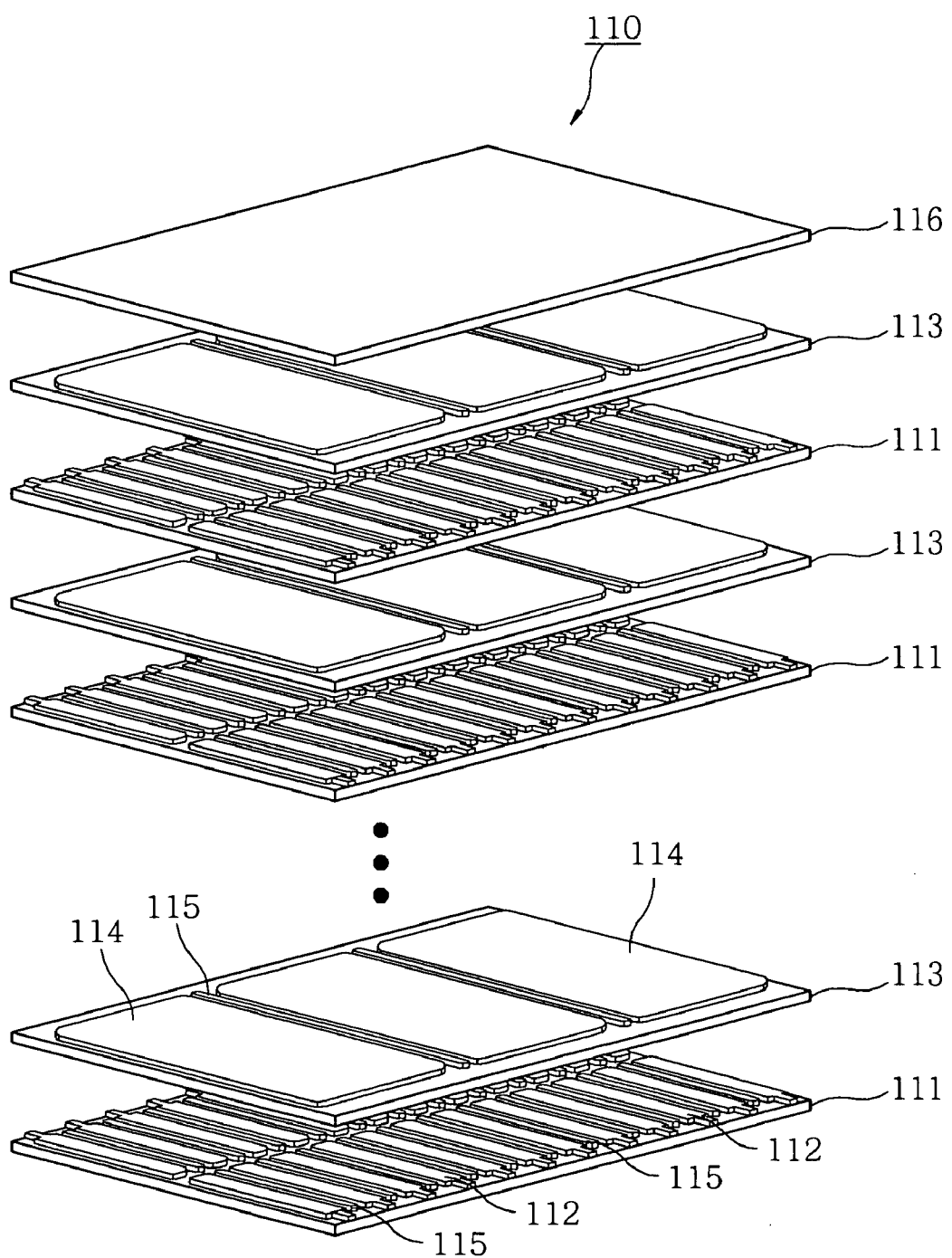
FIG. 6 is an exploded perspective view of a ceramic laminated layer of a high voltage MLCC according to an embodiment of the present invention.

As shown in FIGS. 5A and 5B, a plurality of first inner electrodes 112 and a plurality of second inner electrodes 114 are arranged in an X-axis direction of the ceramic laminated body 100 whereby a plurality of unit capacitors (reference numeral is not assigned) is arranged in the single high voltage MLCC 100. Specifically, the plurality of unit capacitors is provided in the single high voltage MLCC 100 in such a manner that the plurality of inner electrodes 112 corresponds to the single second inner electrode 114. The above plurality of second inner electrodes 114 is arranged in the X direction and thus a plurality of capacitors may be arranged in the high voltage MLCC 100.

The plurality of side electrode members 120 is formed on both sides of the ceramic laminated body 110, respectively. Each of the side electrode members 120 is formed on a front surface of each of the both sides of the ceramic laminated body 110 where the plurality of first inner electrodes 112 is externally exposed, in order to connect the externally exposed first inner electrodes 112 into one. The plurality of connection electrode members 130 is formed in the ceramic laminated body 110 to be connected to the side electrode members 120, respectively. Specifically, the plurality of connection electrode members 130 may be formed on the ceramic laminated body 110 in the lengthwise direction along the side electrode members 120, respectively. The plurality of external electrodes 140 is formed on the single connection electrode member 130. As described above, the MLCC 100 according to the first embodiment of the present invention may be mounted on a solder pattern 215 of a printed circuit board 210 of FIG. 9 using a surface mounting scheme by forming the plurality of external electrodes 140 on the bottom of the ceramic laminated body 110 based on a Z-axis direction.

As shown in FIGS. 3B and 4B, in a high voltage MLCC 100 according to a second embodiment of the present invention, a plurality of connection electrode members 130 and a plurality of external electrodes 140 are provided on a top surface and a bottom surface of the ceramic laminated body 110. Like the first embodiment, the plurality of side electrode members 120 is formed on a front surface of both sides of the ceramic laminated body 110 in order to connect a plurality of first inner electrodes 112, externally exposed from the ceramic laminated body 110, into one. The plurality of connection electrode members 130 may be provided on a top surface and a bottom surface of the ceramic laminated layer 110, respectively, to be connected with the side electrode member 120. The plurality of external electrodes 140 is formed on each of the connection electrode members 130 that are provided on the top surface and the bottom surface of the ceramic laminated body 110, respectively, whereby the high voltage MLCC 100 may be mounted on the solder pattern 215 of the printed circuit board 210 using the surface mounting scheme.

As shown in FIGS. 3C and 4C, in a high voltage MLCC 100 according to a third embodiment of the present invention, a plurality of connection electrode members 130 and a plurality of external electrodes 140 are formed on a top surface and a bottom surface of a ceramic laminated body 110, which is the same as the high voltage MLCC 100 of the second embodiment. In this instance, the plurality of side electrode members 120 may be formed to divide, into at least one according to a user demand, and connect a plurality of first inner electrodes 112 externally exposed from the ceramic laminated body 110. Specifically, each of the side electrode members 120 is formed to divide the plurality of first inner electrodes 112, exposed on any one of both sides of the ceramic laminated layer 110, and to thereby connect the divided first inner electrodes 112. The plurality of connection electrode members 130 may be formed in each of the side electrode members 120 along therewith. The plurality of connection electrode members 140 may be formed in the connection electrode member 130.

In the first through the third embodiments of the present invention, the plurality of side electrode members 120, the plurality of connection electrode members 130, and the plurality of external electrodes 140 constituting the high voltage MLCC 100 may use cupper (Cu) or silver (Ag). The plurality of side electrode members 20 made of Cu or Ag may not be formed using a dipping scheme as the high voltage MLCC 100 is enlarged. Therefore, the plurality of side electrode members 120 may be formed using any one of a plating scheme, a sputtering scheme, and a silk printing scheme. Also, the plurality of connection electrode members 130 may be further readily connected to the side electrode members 120 using a conductive tape member.

As shown in FIG. 6 and FIGS. 7A through 7E, the ceramic laminated body 110 included in the high voltage MLCC 100 where the plurality of unit capacitors is arranged may include a plurality of first ceramic sheets 111 and a plurality of second ceramic sheets 113.

Figure 7B:
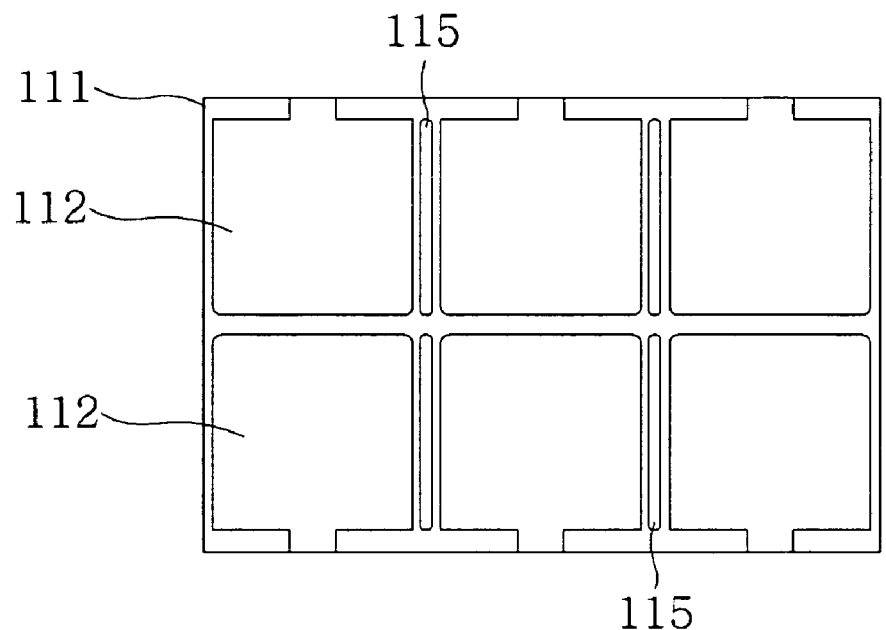
Figure 7C:
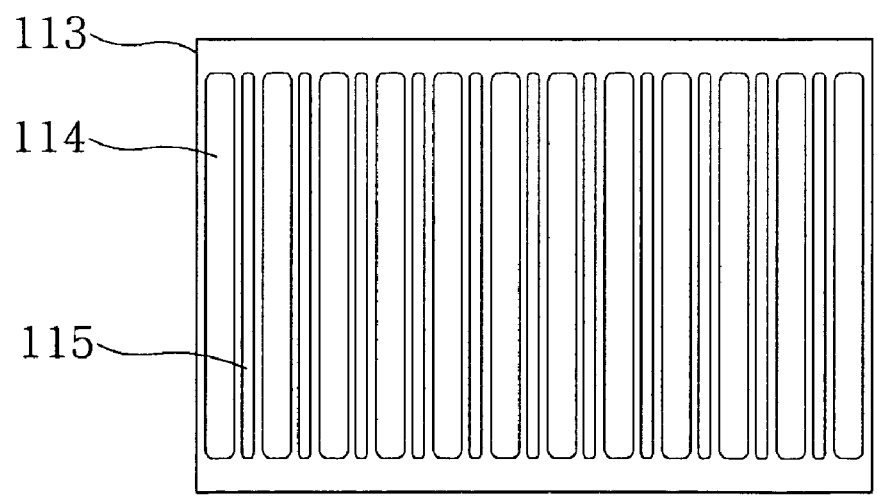
Figure 7D:
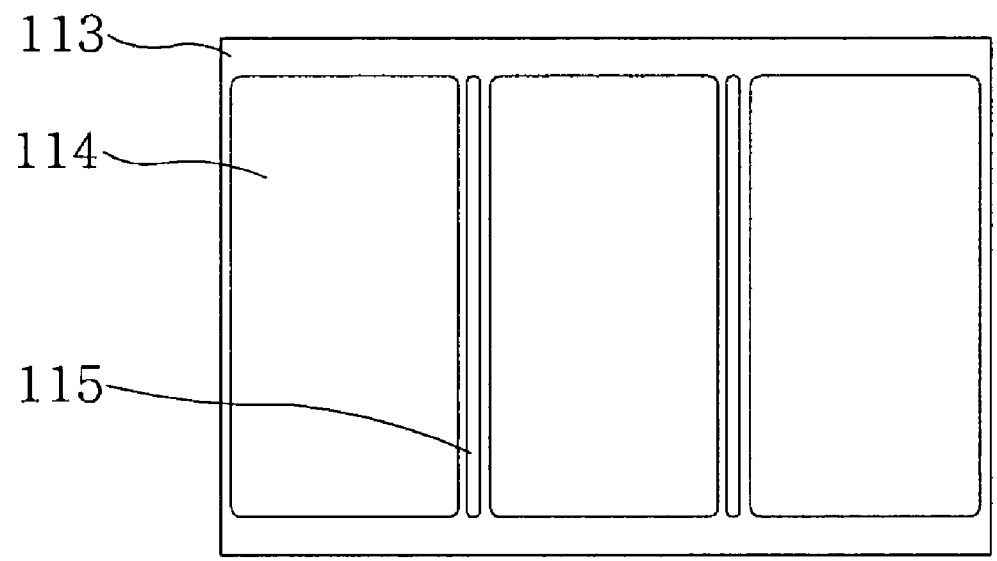

As shown in FIGS. 7A and 7B, each of the plurality of first ceramic sheets 111 includes a plurality of first inner electrodes 112 with various sizes that are connected to the side electrode member 120. Each of the plurality of first inner electrodes 112 connected to the first ceramic sheet 111 includes an inner conductive pattern 112a and an inner conductive connection pattern 112b. The inner conductive pattern 112a is formed on the first ceramic sheet 111. The inner conductive connection pattern 112b is integrally formed with the inner conductive pattern 112a to be connected to the side electrode member 120. A width W2 of the inner conductive connection pattern 112b is formed to be less than a width W1 of the inner conductive pattern 112a. As shown in FIGS. 7C and 7D, a plurality of first ceramic sheets 112 may be disposed between the plurality of first ceramic sheets 111. Each of a plurality of second inner electrodes 114 with various sizes may be formed in a location corresponding to the first inner electrode 112.

Figure 7E:
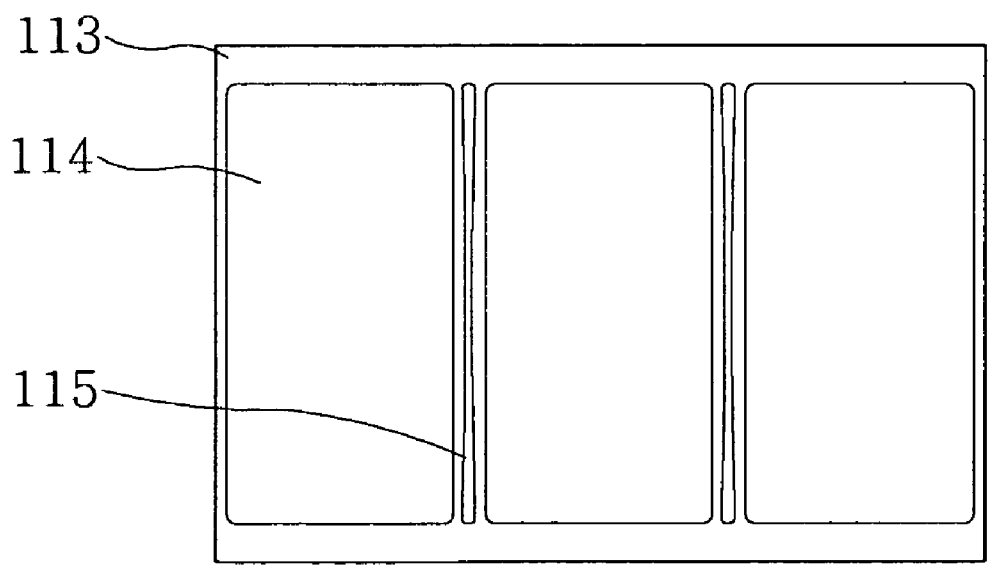

A guide electrode 115 is further provided between the plurality of first inner electrodes 112 formed on each of the first ceramic sheets 111, and between the plurality of second inner electrodes 114 formed on each of the second ceramic sheets 113. As shown in FIG. 7E, the guide electrode 115 is formed in an edge removed square pattern or in a concave pattern, whereby it is possible to prevent a decrease in a voltage caused by a parasitic capacitance, which may occur since the plurality of first inner electrodes 112 or the plurality of second inner electrodes 114 is adjacent to each other.

When the plurality of first ceramic sheets 111 and the plurality of second ceramic sheets 113 are alternately provided, an insulating cover sheet 116 is further provided in an upper portion. When the plurality of first ceramic sheets 111 and the plurality of second ceramic sheets 113 are disposed, the insulating cover sheet 116 may be formed on the first ceramic sheet 111. By alternately disposing the plurality of first ceramic sheets 111 and the plurality of second ceramic sheets 113, the ceramic laminated body 110 may be formed as shown in FIGS. 5A and 5B. Here, FIG. 5A is a cross-sectional view of the high voltage MLCC 100 cut along an Y-axis direction, and FIG. 5B is a cross-sectional view of the high voltage MLCC 100 cut along an X-axis direction.

Hereinafter, a DC-link capacitor module 200 using the high voltage MLCC 100 constructed as above will be described in detail with reference to the accompanying drawings.

Figure 8:
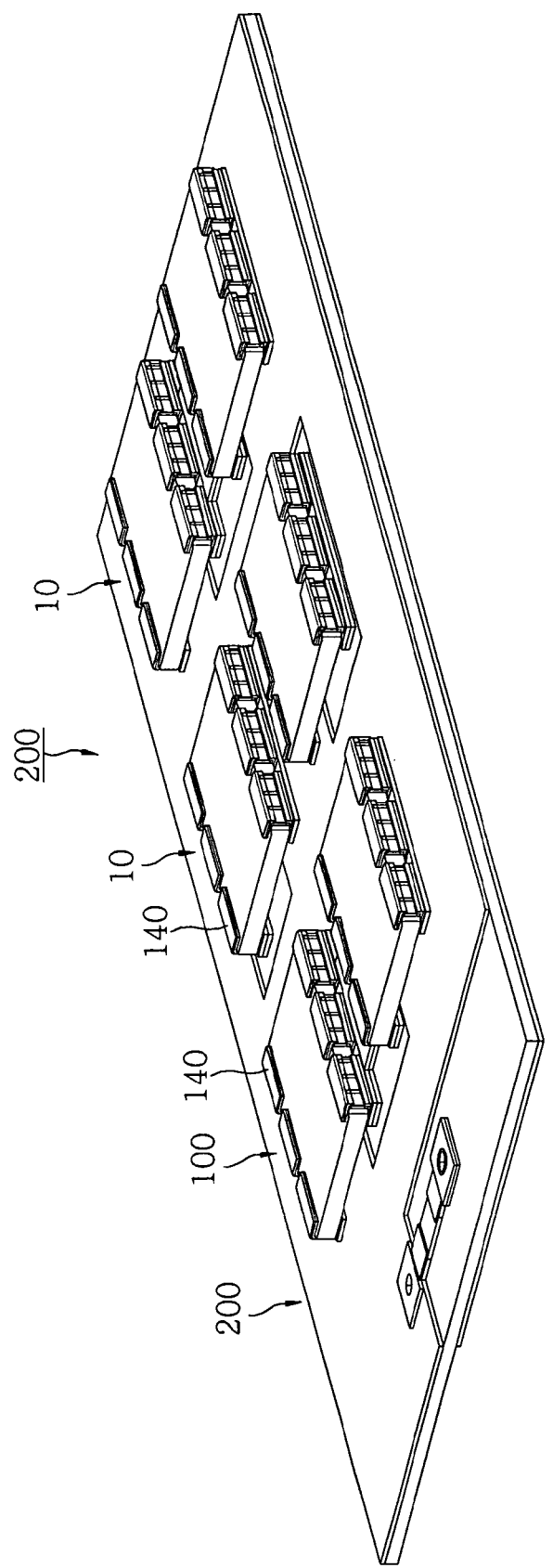
FIG. 8 is a perspective of a DC-link capacitor module according to an embodiment of the present invention.
Figure 9:
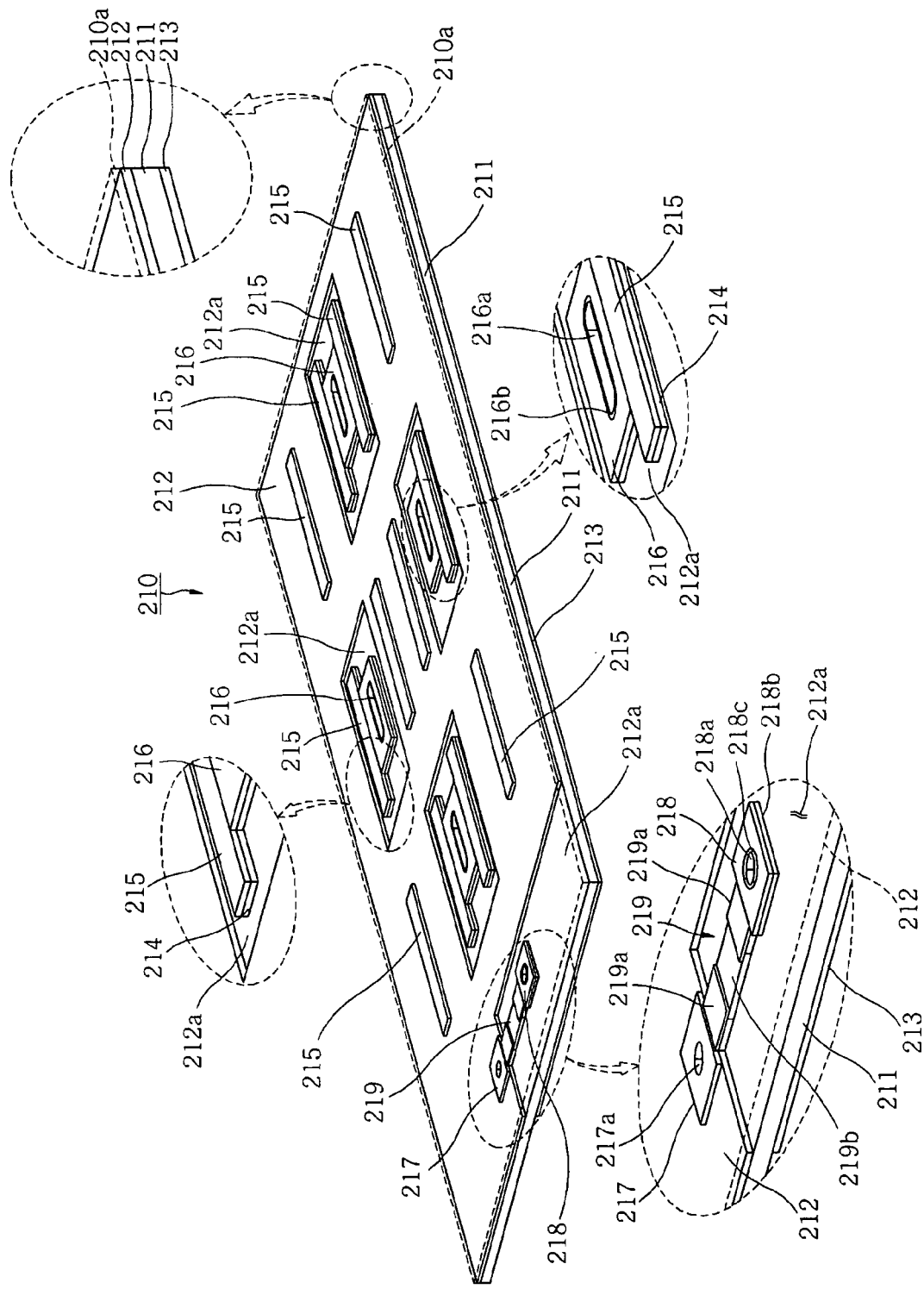
FIG. 9 is a perspective view of a printed circuit board of FIG. 8.

As shown in FIGS. 8 and 9, the DC-link capacitor module 200 includes a plurality of MLCCs 100 and a printed circuit board 210.

Each of the high voltage MLCCs 100 includes a ceramic laminated body 110, a plurality of side electrode members 120, a plurality of connection electrode members 130, and a plurality of external electrodes 140. The plurality of side electrode members 120 is formed on both sides of the ceramic laminated body 110, respectively. The plurality of connection electrode members 130 may be formed on each of the both sides of the ceramic laminated body 110 to be connected to the side electrode members 120. The plurality of external electrodes 140 may be formed on the connection electrode member 130 to be mounted on the solder pattern 215.

The plurality of MLCCs 100 may be mounted to the printed circuit board 210. The printed circuit board 210 includes an insulating base member 211, a first copper layer 212, a second copper layer 213, a plurality of copper patterns 214, a plurality of solder patterns 215, and a plurality of via hole patterns 216.

The insulating base member 211 generally supports the printed circuit board 210. The first copper layer 212 is formed on any one of a top surface and a bottom surface of the insulating base member 211, and a plurality of openings 212a is formed in the first copper layer 212 to expose the insulating base member 211. The second copper layer 213 is formed on another surface of the top surface and the bottom surface of the insulating base member 212, and includes a second opening 213 to expose the insulating base member 211. The plurality of copper patterns 214 is formed on the insulating base member 211 exposed by the plurality of first openings 212a.

The plurality of solder patterns 215 is formed on the first copper layer 212 and the plurality of copper patterns 214. The external electrode 140 of the high voltage MLCC 100 is mounted onto the solder pattern 215. The plurality of via hole patterns 216 is formed on the insulating base member 211 to be connected to the plurality of copper patterns 214 and the second copper layer 213. A hole 216a is formed in each of the via hole patterns 216. The hole 216a is formed of a long slit and an inner circumferential surface of the hole 216a is formed with a conductive connection member 216b to connect the solder pattern 215 and the second copper layer 213.

The printed circuit board 210 further includes a plurality of fixing hole pattern members 217 that functions as an input/output terminal. One of the fixing hole pattern members 217 is connected to the first copper layer 212 and another one of the fixing hole pattern members 217 and 218 is connected to the second copper layer 213. Each of the fixing hole pattern members 217 and 218 is formed of a conductive material.

Figure 1:
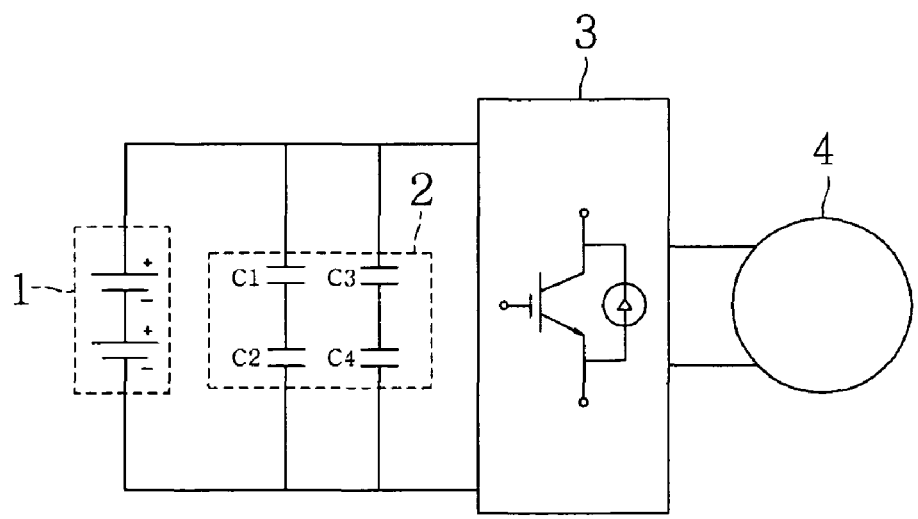
FIG. 1 is a circuit diagram for transferring a power of a hybrid vehicle according to a conventional art.
Figure 2:
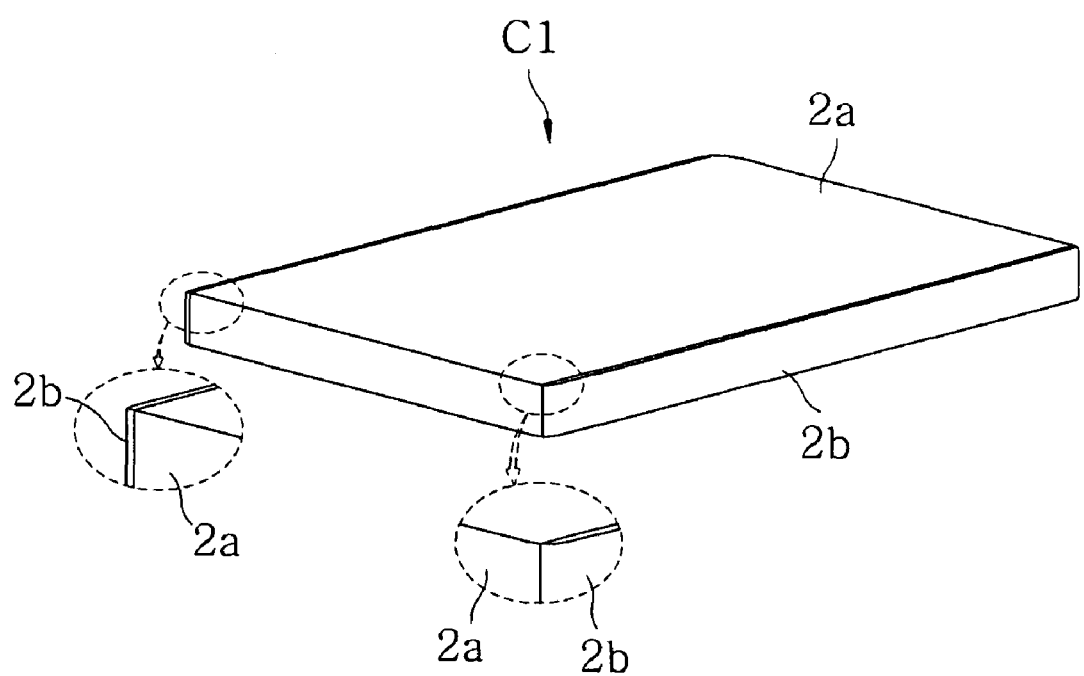
FIG. 2 is a perspective view of a capacitor of FIG. 1.

A hole 217a is formed in one of the fixing hole pattern members 217 and 218. The hole 217a is formed to pass through the insulating base member 211 exposed by the second opening 213a formed in the first copper layer 212 and the second copper layer 213. Also, a hole 218a is formed in another one of the fixing hole pattern members 217 and 218. The hole 218a is formed to pass through the insulating base member 211, the second copper 213, and a copper connection pattern 218b formed on the insulating base member 211 that is exposed by any one of the first openings 212a formed in the first copper layer 212. A conductive connection member 218c is formed on an inner circumferential surface of the hole 218a to connect the copper connection pattern 218b and the second copper layer 213. A fixing member (not shown) such as a bolt or a nut is inserted between the plurality of fixing hole pattern members 217 and 218 when connecting the DC-link capacitor module 200 to the battery 1 or the inverter 3 of FIG. 1.

The printed circuit board 210 may further include a sealing resistance 219. The sealing resistance 219 includes a plurality of resistance electrode members 219a and a resistance body 219b. The plurality of resistance electrode members 219a is connected to the plurality of fixing hole pattern members 217 and 218, respectively, and the resistance body 219b is connected to the plurality of resistance electrode members 219a. One of the resistance electrode members 219a connected to the resistance body 219b is connected to one of the fixing hole pattern members 217 and 218, and another one thereof is connected to another one of the fixing hole pattern members 217 and 218. A resistance (not shown) included in the DC-link capacitor module 200 is provided as the sealing resistance 219. Through this, it is possible to prevent a contact error that may occur due to an impact or a vibration of a vehicle. The sealing resistance 219 may be sealed in a groove (not shown) by forming the groove on the insulating base member 211 of the printed circuit board 210.

In order to seal the sealing resistance 219 formed in the printed circuit board 210, the printed circuit board 210 may further include an insulating layer protection layer 210 on at least one of a top surface and a bottom surface of the insulating base member 211. The insulating layer protection layer 210a is formed in the first copper layer 212 to expose the plurality of first openings 212a and the solder pattern 215.

Figure 10:
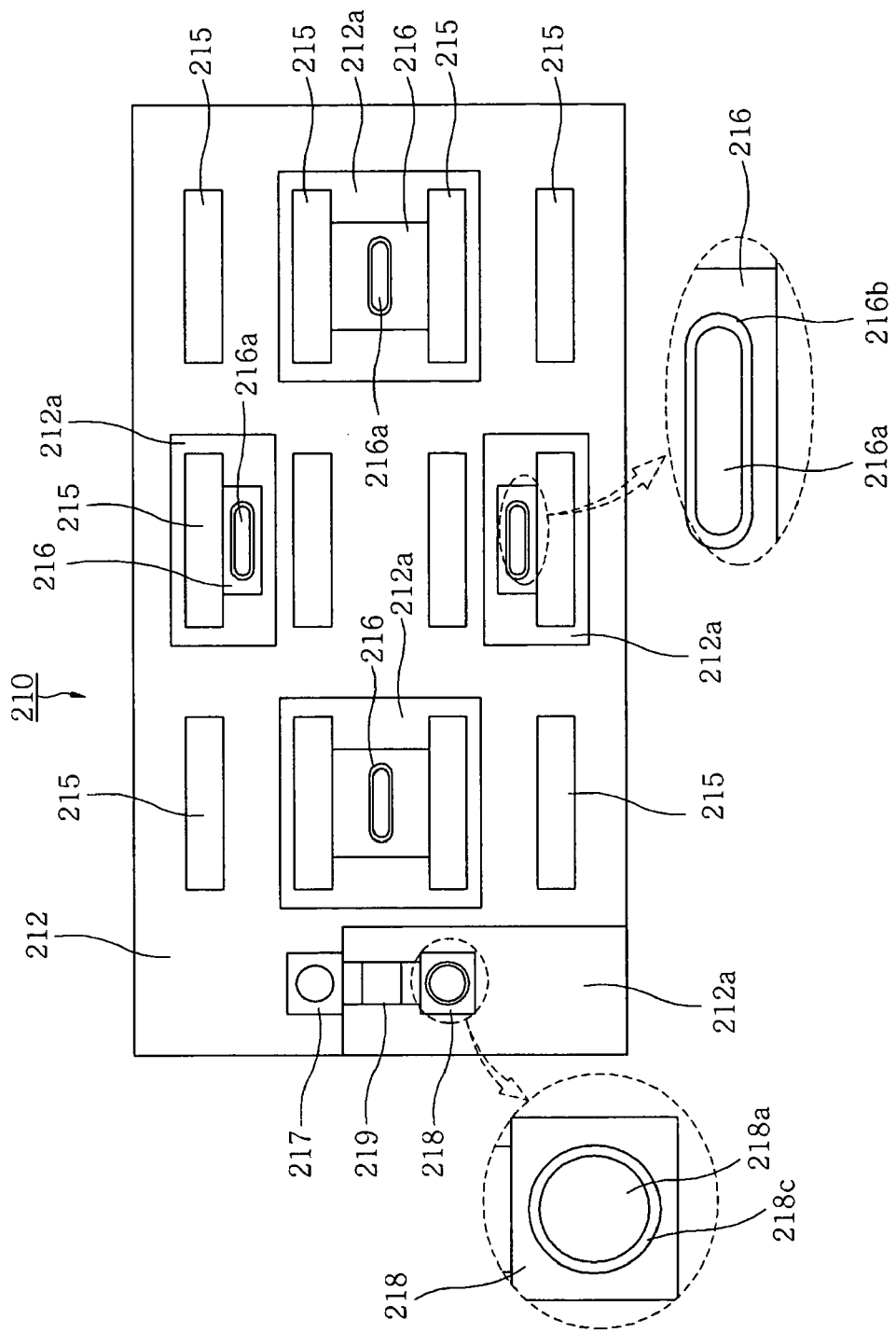
FIG. 10 is a top view of a printed circuit board of FIG. 9.
Figure 11:
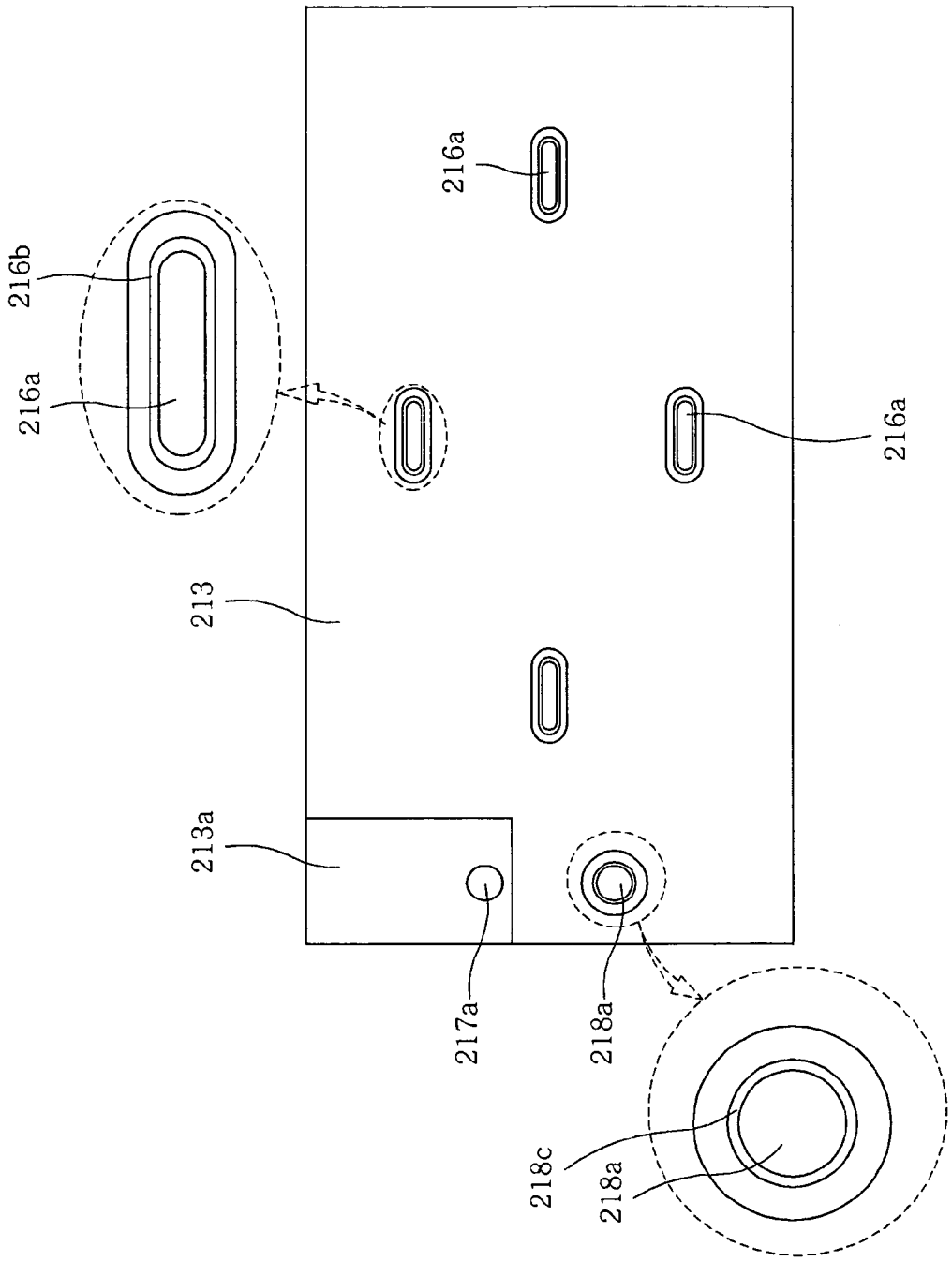
FIG. 11 is a rear view of the printed circuit board of FIG. 9.

In the DC-link capacitor module 200 constructed as above, the first copper layer 212 and the second copper layer 213 are provided on the top surface and the bottom surface of the insulating base member 211, respectively, as shown in FIGS. 10 and 11. Specifically, the first copper layer 212 may be formed on the whole surface of the top surface of the insulating base member 211 as shown in FIG. 10. The second copper layer 213 may be formed on the whole surface of the bottom surface of the insulating base member 211 as shown in FIG. 11.

A predetermined number of external electrodes 140 among the plurality of external electrodes 140 formed on the ceramic laminated body 110 of the high voltage MLCC 100 may be mounted to the solder pattern 215 formed on the first copper layer 212 to be electrically connected to the first copper layer 212. The remaining number of external electrodes 140 may be mounted to the solder pattern 215 formed on the first opening 212a, to not be electrically connected to the first copper layer 212. The solder pattern 215 formed on the first opening 212a is connected to the via hole pattern 216 and is electrically connected to the second copper layer 213 via the via hole pattern 216. Through this, the remaining external electrodes 140 among the plurality of external electrodes 140 mounted on the solder pattern 215 formed on the first opening 212a are electrically connected to the second copper layer 213.

As described above, the predetermined number of external electrodes 140, among the plurality of external electrodes 140 included in the single high voltage MLCC 100, are connected to the first copper layer 21. The remaining external electrodes 140 are divided by the second copper layer 213 and thereby are connected. Accordingly, the plurality of high voltage MLCCs 100 may be in series or in parallel connected to each other to thereby constitute the DC-link capacitor module 200. An input/output of the high voltage MLCCs 100 is connected to the battery 1 or the inverter 3 via the plurality of fixing hole pattern members 217 and 218 connected to the first copper layer 212 and the second copper layer 213, respectively.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A high voltage multi-layer ceramic capacitor (MLCC) comprising:
    a ceramic laminated body;
    a plurality of side electrode members being formed on both sides of the ceramic laminated body, respectively;
    a plurality of connection electrode members being formed on the ceramic laminated body to be connected to the side electrode member; and
    a plurality of external electrodes being formed on each of the connection electrode members,
    wherein the ceramic laminated body comprises a plurality of first ceramic sheets where a plurality of first inner electrodes is connected to the plurality of side electrode members, respectively, and a plurality of second ceramic sheets being disposed between the plurality of first ceramic sheets, and where a plurality of second inner electrodes is formed in a location corresponding to the first inner electrode.

2. The high voltage MLCC of claim 1, wherein each of the plurality of side electrode members, the plurality of connection electrode members, and the plurality of external electrodes is made of cupper (Cu) or silver (Ag).

3. The high voltage MLCC of claim 1, wherein each of the plurality of side electrode members, the plurality of connection electrode members, and the plurality of external electrodes is formed using any one of a plating scheme, a sputtering scheme, and a silk printing scheme.

4. The high voltage MLCC of claim 1, wherein the plurality of connection electrode members is conductive tape members.

5. The high voltage MLCC of claim 1, wherein the plurality of connection electrode members and the plurality of external electrodes are formed on each of a top surface and a bottom surface of the ceramic laminated body.

6. The high voltage MLCC of claim 1, wherein each of the first inner electrodes formed on each of the first ceramic sheets comprises:
    an inner conductive pattern being formed on each of the first ceramic sheets; and
    an inner conductive connection pattern being integrally formed to be connected to the inner conductive pattern, and being connected to the side electrode member, and
    a width of the inner conductive connection pattern is formed to be less than a width of the inner conductive pattern.

7. The high voltage MLCC of claim 1, wherein a guide electrode is further provided between the plurality of first inner electrodes formed on each of the first ceramic sheets of the ceramic laminated body, and between the plurality of second inner electrodes formed on each of the second ceramic sheets.

8. The high voltage MLCC of claim 7, wherein the guide edge is formed in an edge-removed square pattern or a concave pattern.

9. A direct link (DC)-link capacitor module comprising:
    a plurality of high voltage MLCCs, each, comprising a ceramic laminated body, a plurality of side electrode members being formed on both sides of the ceramic laminated body, respectively, a plurality of connection electrode members being formed on the ceramic laminated body to be connected to the side electrode member, and a plurality of external electrodes being formed on each of the connection electrode members; and
    a printed circuit board being mounted with the plurality of high voltage MLCCs,
    wherein the printed circuit board comprises an insulating base member, a first copper layer being disposed on any one of a top surface and a bottom surface of the insulating base member, and including a plurality of first openings to expose the insulating base member, a second copper layer being disposed on another one of the top surface and the bottom surface of the insulating base member, and including a second opening to expose the insulating base member, a plurality of copper patterns being formed on the insulating base member exposed by the plurality of first openings, a plurality of solder patterns being formed on the first copper layer and the plurality of copper patterns, and being mounted with the external electrodes of the high voltage MLCC, and a plurality of via-hole patterns being formed on the insulating base member to be connected to the plurality of copper patterns and the second copper layer.

10. The DC-link capacitor module of claim 9, wherein a long hole is formed in each of the via-hole patterns formed on the insulating base member of the printed circuit board, and a conductive connection member is formed on an inner circumferential surface of the hole to connect the solder pattern and the second copper layer.

11. The DC-link capacitor module of claim 9, wherein the printed circuit board further comprises a plurality of fixing hole pattern members that functions as an input-output terminal, and one of the fixing hole pattern members is connected to the first copper layer and another one thereof is connected to the second copper layer.

12. The DC-link capacitor module of claim 11, wherein each of the fixing hole pattern members is formed of a conductive material.

13. The DC-link capacitor module of claim 11, wherein a hole is formed in any one of the fixing hole pattern members, and the hole passes through the insulating base member exposed by the second opening formed on the second copper layer and the first copper layer.

14. The DC-link capacitor module of claim 11, wherein a hole is formed in any one of the fixing hole pattern members, the hole passes through the copper connection pattern, formed on the insulating base member exposed by one of the first openings formed on the first copper layer, the insulating base member, and the second copper layer, and the conductive connection member is formed in an inner circumferential surface of the hole to connect the copper connection pattern and the second copper layer.

15. The DC-link capacitor module of claim 9, wherein the printed circuit board further includes a sealing resistance, and the sealing resistance comprises:
    a plurality of resistance electrode members being connected to a plurality of fixing hole pattern members, respectively; and
    a resistance body being connected to the plurality of resistance electrode members,
    wherein one of the resistance electrode members is connected to one of the fixing hole pattern members, and another one of the resistance electrode members is connected to another one of the fixing hole pattern members.

16. The DC link capacitor module of claim 9, wherein the printed circuit board further includes an insulating layer protection layer on at least one of a top surface and a bottom surface of the insulating base member, and the insulating layer protection layer is formed on the first copper layer to expose the plurality of first openings and the solder pattern.

\* \* \* \* \*